US012555882B2

(12) United States Patent
Chan Wai Po et al.

(10) Patent No.: US 12,555,882 B2
(45) Date of Patent: Feb. 17, 2026

(54) ADAPTIVE RADIO FREQUENCY FILTER WITH IMPROVED LINEARITY

(71) Applicant: THALES, Courbevoie (FR)

(72) Inventors: Francis Chan Wai Po, Elancourt (FR); Vincent Petit, Elancourt (FR); Bruno Louis, Elancourt (FR)

(73) Assignee: THALES, Courbevoie (FR)

( * ) Notice: Subject to any disclaimer, the term of this patent is extended or adjusted under 35 U.S.C. 154(b) by 297 days.

(21) Appl. No.: 18/072,588

(22) Filed: Nov. 30, 2022

(65) Prior Publication Data

US 2023/0178867 A1     Jun. 8, 2023

(30) Foreign Application Priority Data

Dec. 7, 2021 (FR) ..................... 21 13057

(51) Int. Cl.
*H01P 1/20* (2006.01)
*H03H 11/08* (2006.01)
*H03H 21/00* (2006.01)

(52) U.S. Cl.
CPC .............. *H01P 1/20* (2013.01); *H03H 11/08* (2013.01); *H03H 21/0001* (2013.01)

(58) Field of Classification Search
CPC .... H03H 11/1243; H03H 11/08; H03H 11/50; H03H 7/03; H03H 21/0001; H01P 1/20
See application file for complete search history.

(56) References Cited

U.S. PATENT DOCUMENTS

| 3,737,801 | A | | 6/1973 | Adams et al. | |
|---|---|---|---|---|---|
| 5,168,251 | A | * | 12/1992 | Zennamo, Jr. ....... | H03H 7/1791 333/167 |
| 5,535,087 | A | * | 7/1996 | Puckett ................. | H02H 9/005 333/175 |
| 5,625,894 | A | * | 4/1997 | Jou ......................... | H04B 1/52 333/175 |
| 6,184,747 | B1 | | 2/2001 | Helgeson et al. | |
| 11,637,355 | B1 | * | 4/2023 | Zhang .................... | H01P 1/32 333/24.1 |
| 2005/0250467 | A1 | * | 11/2005 | Contopanagos ....... | H03H 7/03 455/339 |
| 2009/0134954 | A1 | * | 5/2009 | Uzunov ................. | H03H 7/1766 333/174 |
| 2009/0153259 | A1 | * | 6/2009 | Kim ..................... | H03B 5/1259 331/167 |
| 2010/0164648 | A1 | * | 7/2010 | Kravitz .................. | H03H 7/12 333/165 |
| 2011/0148528 | A1 | * | 6/2011 | Lee ....................... | H03F 1/32 330/295 |

(Continued)

FOREIGN PATENT DOCUMENTS

CN     103 905 012     7/2014

OTHER PUBLICATIONS

European Search Report for EP22211791.3, dated May 10, 2023, 11 pages.

(Continued)

*Primary Examiner* — Quan Tra
(74) *Attorney, Agent, or Firm* — NIXON & VANDERHYE

(57) ABSTRACT

An adaptive radio frequency including an input, an output, at least one fixed passive inductor and at least one variable active inductor connected between the input and the output.

19 Claims, 5 Drawing Sheets

(56) References Cited

U.S. PATENT DOCUMENTS

2020/0220242 A1    7/2020   Kim et al.

OTHER PUBLICATIONS

Schaumann: "Continuous-Time Integrated Filters," The Circuits and Filters Handbook, "Passive, Active, and Digital Filters," Chapter 16, Jan. 1, 2009, CRC Press, XP055490855, pp. 16-1 to 16-34.
French Search Report for FR2113057, dated Jul. 26, 2022, 2 pages.
Evgenii Vorobev et al., "Active Tunable Inductor Using non-Foster Element", 201 IEEE Conference of Russian Young Researchers in Electrical and Electronic Engineering (EICONRUS), IEEE, Feb. 1, 2017, pp. 346-349.
Andriesei et al., "Negative Resistance Based Tuning of an RF Bandpass Filter", Faculty of Electronics and Telecommunications, 2008, pp. 83-86.

* cited by examiner

ADAPTIVE RADIO FREQUENCY FILTER WITH IMPROVED LINEARITY

CROSS-REFERENCE TO RELATED APPLICATION

This application is a U.S. non-provisional application claiming the benefit of French Application No. 21 13057, filed on Dec. 7, 2021, which is incorporated herein by reference in its entirety.

FIELD

The invention relates to the field of signal processing, in particular for radio communications and radar systems.

The invention relates more particularly to adaptive radio frequency filters, also called agile filters, or reconfigurable filters. Adaptive filters are apt to be reconfigured so as to change in real-time some of the properties thereof, such as the bandwidth and the cut-off frequency, as needed.

BACKGROUND

Generally, adaptive filters are built either from passive filters or from active filters.

Passive filters include passive inductors, the value of which is fixed. The inductors cannot thus be modified, but the performance and properties of the filter can be modified in real-time by adjusting variable capacitors which are associated with the inductors.

However, such solution has drawbacks.

On the one hand, passive filters have a large bulk, due to the size of passive inductors. Indeed, passive filters generally perform only over a relatively narrow frequency band. In order to have a passive filter apt to be used over a wide frequency band, it is often necessary during the design, to duplicate entire parts of the filter, each of said parts of the filter being optimized over a given frequency band, where the filter has to be then switched by the user so as to select the filter part which corresponds to the needs. It is understood that such duplication of entire parts of the filter increases the bulk and the complexity of filter manufacturing.

On the other hand, for practical reasons, passive filters are usually manufactured using silicon integration technologies. However, passive inductors produced using said technologies often have a low quality factor, which contributes to large insertion losses.

Active filters include variable active inductors, i.e. active electronic circuits simulating the behavior of inductors, where such circuits can include elements such as gyrators and/or amplifiers.

The U.S. Pat. No. 6,184,747 B1 describes an example of an active filter including a gyrator.

However, the linearity performance of active filters, e.g. quantified by the third order intercept point (IIP3), is generally not sufficient for many applications. Moreover, the electrical consumption of variable active inductors is generally high, which can be prohibitive in certain applications.

SUMMARY

The present invention intends more particularly to overcome such drawbacks, by proposing an improved adaptive radio frequency filter.

To this end, one aspect of the invention relates to an adaptive radio frequency filter including an input, an output, at least one variable composite inductor including at least one fixed passive inductor and at least one variable active inductor, the variable composite inductor being connected between the input and the output of the radio frequency filter.

According to advantageous but non-mandatory aspects, such a radio frequency filter can incorporate one or a plurality of the following features, taken individually or according to any technically permissible combination:
- the radio frequency filter further includes a variable capacitor associated with said at least one variable active inductor.
- the radio frequency filter can also include a negative resistance associated with said at least one variable active inductor.
- the radio frequency filter includes a first inter-stage connected to the input of the filter, the first inter-stage including a fixed passive inductor connected in series or in parallel with a variable active inductor so as to form a variable composite inductor.
- the radio frequency filter includes another inter-stage connected to the output of the filter, said inter-stage including a fixed passive inductor connected in series or in parallel with a variable active inductor to form a variable composite inductor.
- a variable active inductor is connected in parallel with the fixed passive inductor so as to form a variable composite inductor.
- the radio frequency filter includes a variable active inductor connected between the input and the output of the filter, as well as a first variable capacitor, a first fixed passive inductor, a second fixed passive inductor and a second variable capacitor respectively connected in parallel with the variable active inductor.
- said at least one variable active inductor includes a gyrator and a variable capacitor connected to the output of the gyrator.
- the gyrator is built from transconductance amplifiers.
- each transconductance amplifier can include an adjustable negative resistance for compensating for the losses of the radio frequency filter.
- the filter includes an electronic control system configured for modifying at least one operating parameter of the radio frequency filter, such as the cut-off frequency, or the bandwidth, or the gain.

BRIEF DESCRIPTION OF THE DRAWINGS

The invention will be better understood and other advantages thereof will appear more clearly in the light of the following description of an embodiment of an adaptive radio frequency filter, given only as an example and made with reference to the enclosed drawings, wherein.

DETAILED DESCRIPTION

Figure 1:
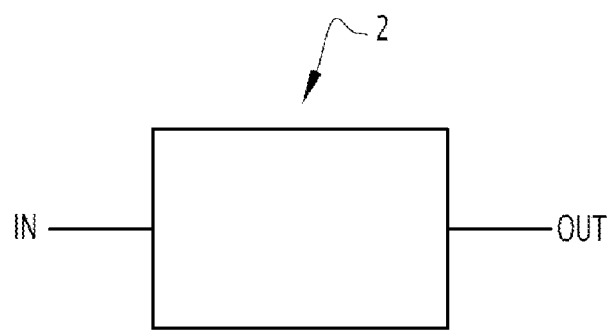
FIG. 1 shows an example of a radio frequency filter.

FIG. 1 shows an example of an adaptive radio frequency filter 2 including an input IN for receiving a radio frequency signal and an output OUT. The input IN e.g. includes one or a plurality of input terminals. The output OUT includes one or a plurality of output terminals.

The adaptive radio frequency filter 2 is an electronic circuit including a plurality of electronic components, in particular inductors.

One aspect of the invention aims in particular, is to propose an adaptive radio frequency filter including one or a plurality of fixed passive inductors combined with one or a plurality of variable active inductors.

For this purpose, at least one variable composite inductor including a fixed inductor and a variable inductor is advantageously used.

The combination of the two types of inductors provides better linearity in the same filter than the use of only active inductors, while reducing the bulk and the insertion losses associated with passive inductors.

In this way it is possible to more finely adjust the equivalent inductor and thus have better agility, e.g. greater ease of reconfiguring the filter.

Figure 2:
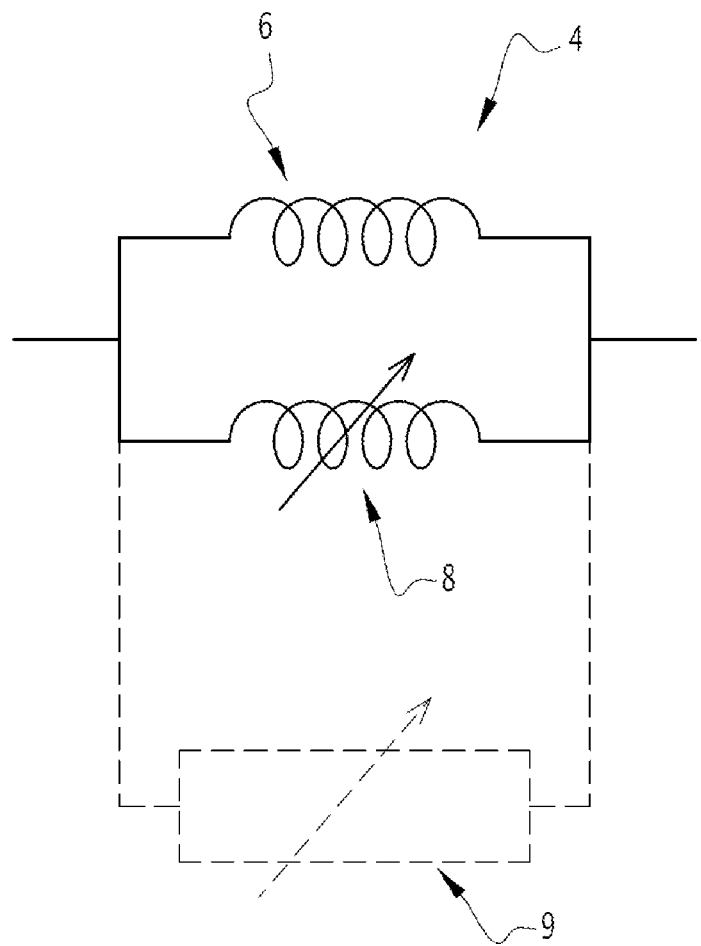
FIG. 2 schematically shows a variable composite inductor which is a part of the adaptive radio frequency filter shown in FIG. 1 and including a fixed inductor and a variable inductor.

As an illustration, FIG. 2 shows a variable composite inductor 4 (or hybrid inductor) including a fixed passive inductor 6 and a variable active inductor 8, both connected in parallel.

The fixed passive inductor 6 is e.g. a passive component such as a coil.

The assembly 4 is e.g. a portion of an adaptive radio frequency filter 2.

In a variant, other ways of coupling a fixed passive inductor 6 with a variable active inductor 8 are possible. It is possible e.g. to build a variable composite inductor wherein the fixed passive inductor 6 is connected in series with the variable active inductor 8.

In practice, to form an adaptive radio frequency filter 2, a plurality of variable composite inductors 4 can be formed, each including one or a plurality of fixed passive inductors 6 coupled (in series, or in parallel, e.g.) with one or a plurality of variable active inductors 8, the variable composite inductors 4 being then connected to each other like modules.

Optionally, as illustrated in FIG. 2, the variable composite inductor 4 can be associated with a negative resistor 9, which will be described in more detail hereinafter. The negative resistance e.g. is connected in parallel with the variable active inductor 8, other ways of associating the negative resistance 9 being possible as a variant.

Figure 3:
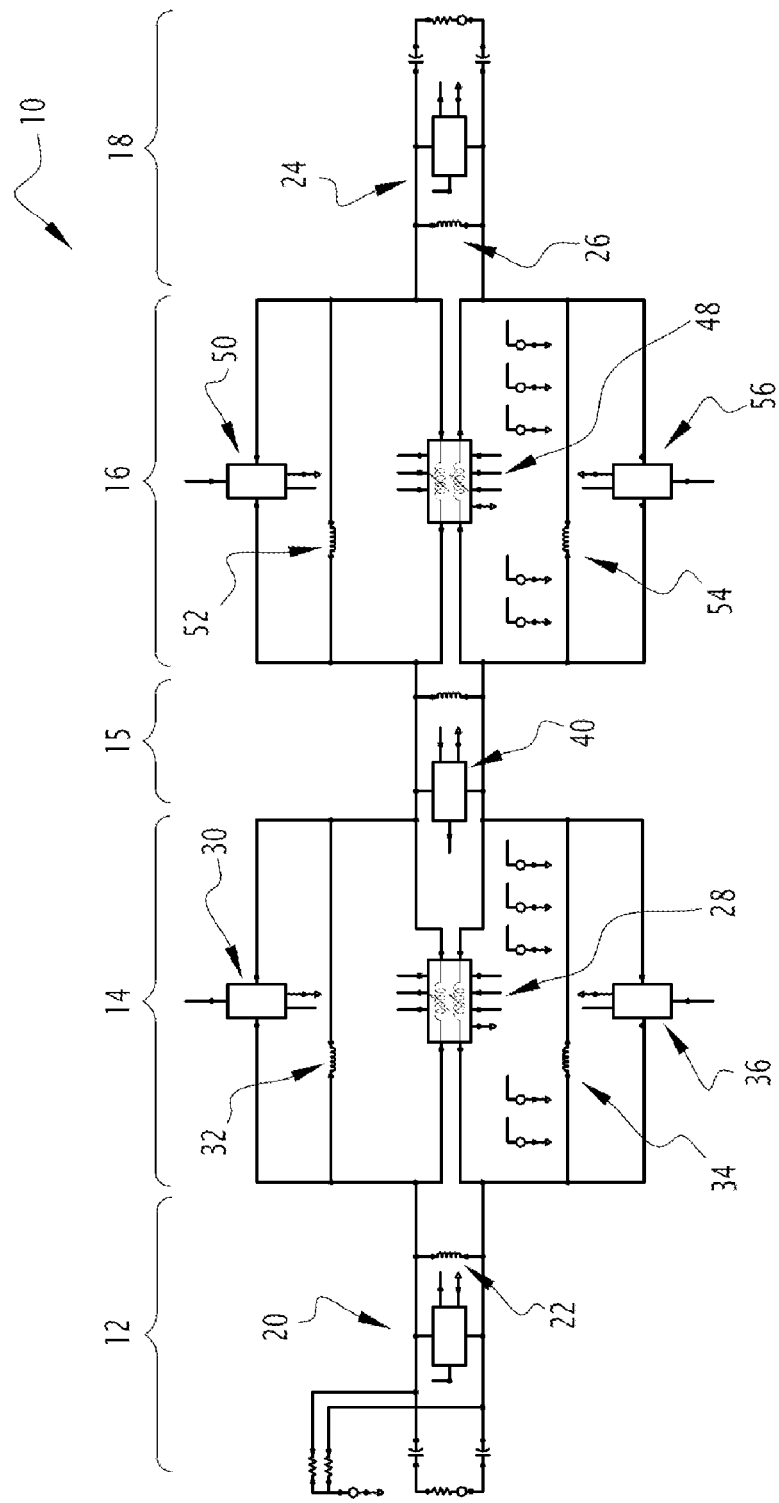
FIG. 3 shows an adaptive radio frequency filter according to a first embodiment of the invention.

FIG. 3 shows an adaptive radio frequency filter 10 according to a first embodiment of the invention.

In such embodiment, the filter 10 includes a plurality of assemblies of components, called inter-stages, among which a first inter-stage 12, a second inter-stage 14, a third inter-stage 15, a fourth inter-stage 16 and a fifth inter-stage 18. The inter-stages are e.g. connected in series between the input and the output terminals of the filter 10. At least a part of the assemblies of components includes a variable composite inductor 4.

The inter-stage 12 includes a variable capacitor 20, herein connected in parallel with the input of the filter 10, and a fixed passive inductor 22 (analogue to the inductor 6), such as a coil, herein connected in parallel with the variable capacitor 20.

In other embodiments, the fixed passive inductor 22 could be connected, in series or in parallel, to at least one variable active inductor so as to form a variable composite inductor.

The inter-stage 18 includes a variable capacitor 24, herein connected in parallel with the output of the filter, and a fixed passive inductor 26 (analogue to the inductor 6), herein connected in parallel with the variable capacitor 24.

In other embodiments, the fixed passive inductor 26 could be connected, in series or in parallel, to at least one variable active inductor so as to form a variable composite inductor.

The inter-stage 18 e.g. can be built in a similar or symmetrical manner with respect to the inter-stage 12, other embodiments nevertheless being possible as a variant. However, the capacitance and inductor values of the components of the inter-stage 18 are not necessarily identical to capacitance and inductor values of the components of the inter-stage 12.

The inter-stage 14 includes at least one variable active inductor, and preferentially two variable active inductors 8, herein comprised in the module 28, the variable active inductors of the module 28 being herein connected in series with the inter-stage 12.

In a differential configuration e.g., the block 28 is equivalent to two variable inductors 8 of the same value: one connected between the positive input and the positive output and the other between the negative input and the negative output of the block 28.

The inter-stage 14 further includes a first variable capacitor 30, a first fixed passive inductor 32, a second fixed passive inductor 34 and a second variable capacitor 36.

Each of the elements 30, 32, 34 and 36 e.g. is connected in parallel with the variable active inductors 28.

In said example, a first variable composite inductor of the inter-stage 14 is formed by the association of the first fixed passive inductor 32 and one of the variable active inductors of the module 28. A second variable composite inductor of the inter-stage 14 is formed by the association of the second fixed passive inductor 34 and of the other of the variable active inductors of the module 28. The two variable composite inductors have herein the same value.

The association of a variable composite inductor with a variable capacitor makes it possible to form a variable LC resonant circuit.

The inter-stage 14 is connected in series with the inter-stage 16, herein via the inter-stage 15, the latter including a variable capacitor 40 and a fixed passive inductor, connected in parallel with each other.

The inter-stage 16 includes at least one variable active inductor 8 and preferentially two variable active inductors 8, herein included in a module 48 (analogue to the module 28), the variable active inductors of the module 48 being herein connected in series between the inter-stage 15 and the inter-stage 18.

The inter-stage 16 further includes a first variable capacitor 50, a first fixed passive inductor 52, a second fixed passive inductor 54 and a second variable capacitor 56.

Each of these elements 50, 52, 54 and 58 e.g. is connected in parallel with the variable active inductor 28. The inter-stage 16 e.g., which has a differential configuration, is built in an analogue or symmetrical or identical way to the inter-stage 14, other embodiments being however possible as a variant.

In said example, a first variable composite inductor of the inter-stage 16 is formed by the association of the first fixed passive inductor 52 and one of the variable active inductors of the module 48. A second variable composite inductor of the inter-stage 16 is formed by the association of the second fixed passive inductor 54 and of the other of the variable active inductors of the module 48.

Although not illustrated in detail in FIG. 2, the filter 10 can further include one or a plurality of negative resistors 9, the negative resistor(s) 9 being preferentially associated with at least one of the variable active inductors, or even with each of the variable active inductors.

The filter 10 further includes a power supply system, which is not shown in FIG. 3, and which is configured e.g. for supplying electrical power to the active components of the filter 10, such as variable capacitors and active inductors.

The filter 10 can further include an electronic control system configured for modifying at least one operating parameter of the filter, such as the cut-off frequency, or the bandwidth, or the gain. Such modification is performed e.g. by controlling one or a plurality of the variable elements of the filter 10, such as the variable capacitors and/or the variable active inductors.

It will be understood that the example of filter 10 is given for illustrative purposes and that, as a variant, many other filters can be built in a similar way, e.g. by combining assemblies of components (inter-stage) in a different way depending on the desired properties, at least a part of such assemblies of components preferentially including a variable composite inductor 4.

Figure 4:
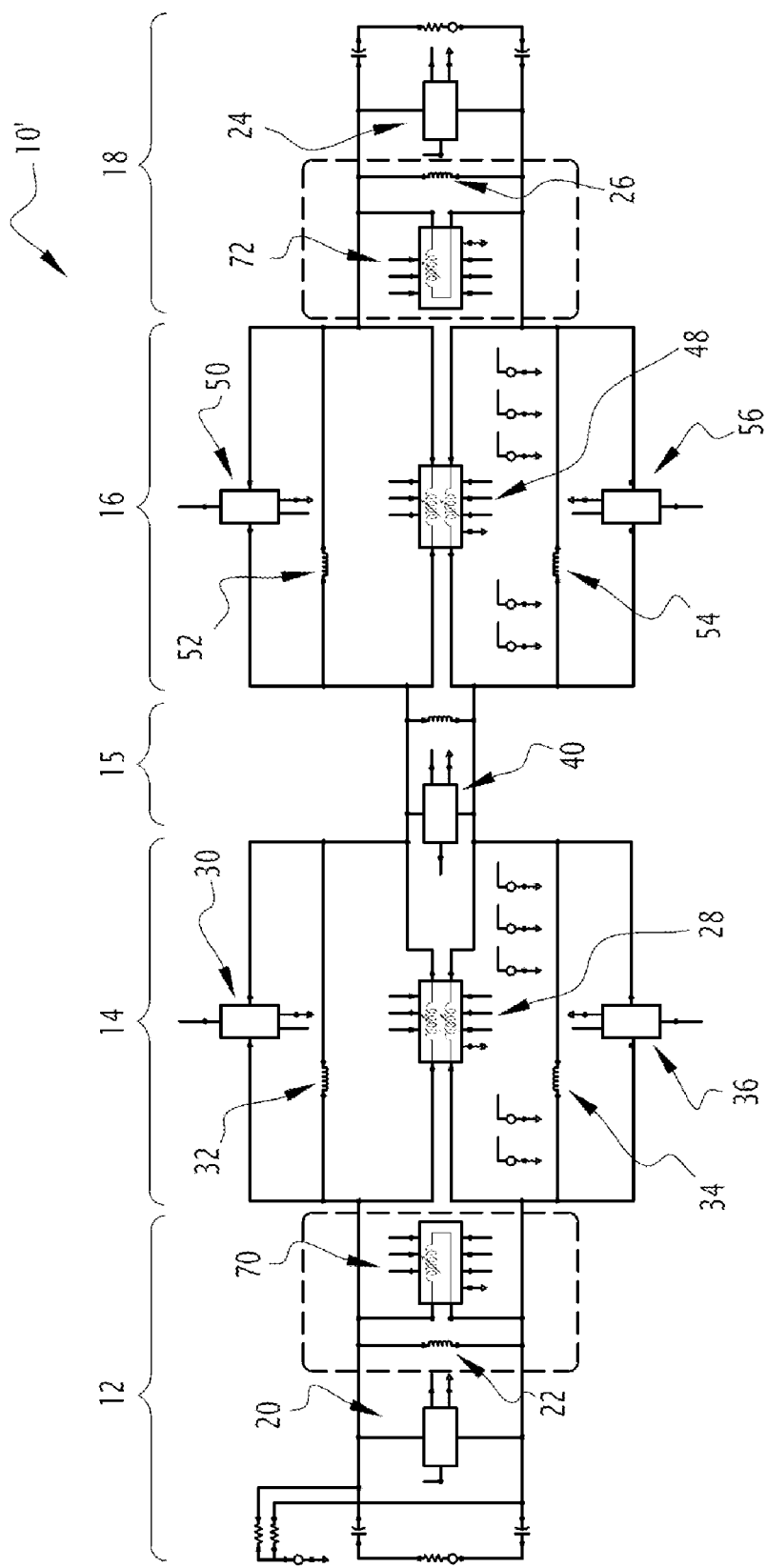
FIG. 4 shows an adaptive radio frequency filter according to a second embodiment of the invention.

FIG. 4 shows an adaptive radio frequency filter 10' according to a second embodiment of the invention.

The radio frequency filter 10' is largely identical to the radio frequency filter 10, except that the radio frequency filter 10' includes two additional variable active inductors 70 and 72 placed respectively in the input stage 12 and in the output stage 18, e.g. by being connected in parallel to the fixed passive inductor 22 or 26.

In practice, the additional variable active inductors 70 and 72 do not necessarily have the same values and can be controlled independently, although same can be identical in certain examples.

Each of the additional variable active inductors 70 and 72 e.g. includes an adjustable variable inductor 8 as described hereinabove.

In said example, a variable composite inductor of the inter-stage 12 is formed by the association of the fixed passive inductor 22 and of an additional variable active inductor (one of the inductors of the module 70). Similarly, a variable composite inductor of the inter-stage 18 is formed by the association of the fixed passive inductor 26 and an additional variable active inductor (e.g. one of the inductors of the module 72).

Apart from such differences, everything described with reference to the filter 10 of FIG. 3 also applies to the radio frequency filter 10' in the second embodiment.

Many other variants of the filter 10 or 10' can be built by combining fixed passive inductors, variable capacitors and variable active inductors. In such variants, the number and arrangement of the various constituent elements of the filter can be different from the elements of the examples presented above.

In many embodiments, the variable capacitors 30, 36, 50 and 56 are produced using variable capacitance diodes (e.g. varactor diodes). It is also possible to use capacitor banks including several capacitors apt to be selectively connected or disconnected by means of controllable switches, such as transistors used as switches.

The equivalent capacitance values of such variable capacitors are selected according to the frequency band targeted for the filter operation. Such selection can be made using a software, e.g. by an electronic control system for the filter 10, in order to govern the controls by means of a control signal In the case of a capacitor bank e.g., switches can be controlled digitally with a control voltage applied to a switch control electrode (e.g. to the gate of a field effect transistor).

In many embodiments, each adjustable active inductor 8, 28, 48, 70, 72 includes an active electronic circuit simulating the behavior of an inductor.

Said electronic circuit can e.g. include one or a plurality of gyrators, and/or amplifiers, or any other suitable element.

Preferentially, each adjustable active inductor 8, 28, 48, 70, 72 includes a plurality of gyrators connected in series and/or in parallel, a variable capacitor being associated with at least a part of the gyrators, preferentially with each gyrator.

Gyrators e.g. can be built from transconductance amplifiers, also called transconductance cells.

Each transconductance cell is associated with a variable capacitor $C_{out}$ placed at the output, in such a way that the value of the variable inductor (Lvar) is a function of the transconductance (gm) and of the capacitance ($C_{out}$) of the corresponding capacitor.

Each transconductance cell e.g. is a quadrupole element which has two input terminals (e.g. a positive terminal and a negative terminal) and two output terminals (e.g. a positive terminal and a negative terminal).

In a first example of construction, a variable active inductor 8 can be formed by building a gyrator by associating two transconductance cells connected in parallel with each other between input terminals of the active inductor circuit and output terminals of the active inductor circuit, each of these gyrators.

In each of the gyrators e.g., the positive terminal of the output of the second transconductance cell is connected to the negative terminal of the input of the first transconductance cell, and the negative terminal of the output of the second transconductance cell is connected to the positive terminal of the input of the first transconductance cell. The negative terminal of the output of the first transconductance cell is connected to the negative terminal of the input of the second transconductance cell, and the positive terminal of the output of the first transconductance cell is connected to the positive terminal of the input of the second transconductance cell.

A variable capacitor is connected between the first and second output terminals of each of the transconductance cells. According to some embodiments, the capacitors can be directly integrated into each transconductance cell, or same can be connected to the output of each transconductance cell.

In order to make the active inductor variable, each of the capacitors $C_{out}$ is configured so as to be variable and adjustable (i.e. that the capacitance value can be modified by a user), e.g. by being electrically controlled by an electronic control system of the filter 10. To this end, each variable capacitor can be made as described above, e.g. by including diodes with variable capacitance controllable in voltage, or by any appropriate means.

In a second example of construction, a variable active inductor 8 can be formed by connecting two gyrators in series, between input terminals of the active inductor circuit and output terminals of the active inductor circuit, each of the gyrators including the association of two transconductance cells connected in parallel with each other, as explained hereinabove.

Here again, a variable capacitor is connected between the first and second output terminals of each of the transconductance cells. According to some embodiments, the capacitors can be directly integrated into the transconductance cell, or alternatively can be connected to the output of each transconductance cell.

Many other embodiments are possible.

Preferentially, each transconductance cell includes an adjustable negative resistor, or negative impedance converter, which serves to compensate the losses of the filter.

The equivalent value of the negative resistance e.g., such as the negative resistance 9, can be controlled by placing an adjustable positive resistance in parallel with the negative resistance. In such an example, the adjustable positive resistance can be built from a field effect transistor (such as a MOSFET) operating in triode mode. Thus connected, such transistor functions as a resistor and the equivalent resistance value thereof can be adjusted by varying the gate voltage applied to the transistor. Other implementations are nevertheless possible as a variant.

Negative resistances are known and are not described in more detail. An example of negative resistance is described in the article by C. Andriesei et al. "Negative resistance based tuning of an RF bandpass filter", Proceedings of the 4th European Conference on Circuits and Systems for Communications, ECCSC, July 2008, Bucharest, Romania, DOI: 10.1109/ECCSC.2008.4611651. Such example of construction is not limiting and other implementations are possible as a variant.

Due to the invention, by combining one or a plurality of fixed passive inductors with one or a plurality of variable active inductors with one or a plurality of negative resistors 9, it is possible to build an adaptive radio frequency filter having a better linearity than by using only active inductors, while reducing the bulk and insertion losses associated with the use of passive inductors alone.

The variable elements of the radio frequency filter, such as active variable inductors and variable capacitors, allow the radio frequency filter to switch from one frequency band to another, without the need to duplicate entire portions of the circuit so as to achieve satisfactory operation over wide frequency bands. Thus, the radio frequency filter is less bulky and less complex to design than known passive radio frequency filters.

Unlike known passive inductor solutions, insertion losses can advantageously be reduced and controlled by means of the negative resistors integrated into the variable active inductors.

Figure 5:
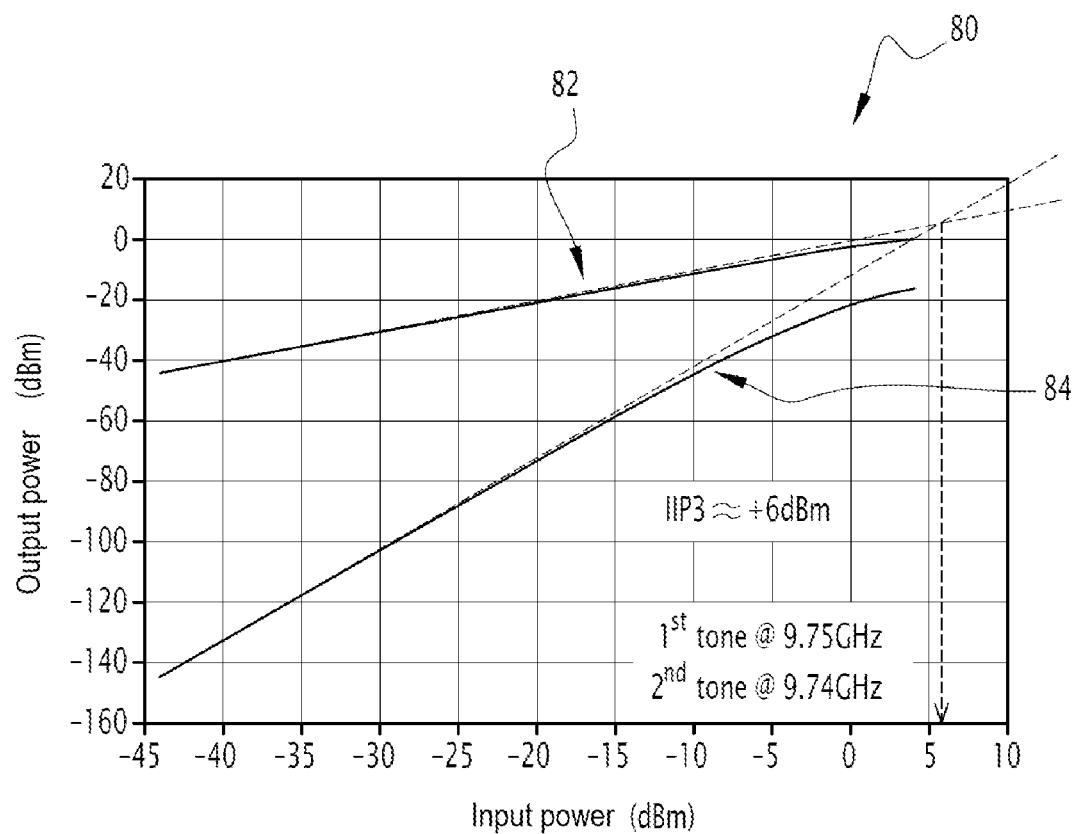
FIG. 5 illustrates the performance of an adaptive radio frequency filter according to the invention.

FIG. 5 shows the performances of the filter 10 shown in FIG. 3, in particular to illustrate the improvement in the linearity performance of the filter 10, by means of intermodulation distortion measurements performed on the filter 10.

In the graph 80, the x-axis corresponds to the input power of test signals supplied to the filter 10, while the y-axis corresponds to the output power of the measured signals.

The first curve 82 corresponds to the fundamental frequency of the test signals whereas the second curve 84 corresponds to the product of the third order intermodulation. The frequencies of the test signals are, in the present example, equal to 9.75 GHz ("$1^{st}$ tone") and to 9.74 GHz ("$2^{nd}$ tone"), respectively.

In the present examples, the filter supply voltage is 1.2V, the amplitude of the filter supply current is 80 mA, and the third order intercept point (IIP3) at the input, extrapolated from curves 82 and 84, is +6 dBm.

Other tests, not shown, performed for other supply voltages and for other frequencies, have shown that linearity performance can be further improved, e.g. for obtaining a third order intercept point (IIP3) reaching up to over +20 dBm.

Such linearity and power consumption performance is better than the performance of conventional adaptive filters, such as filters built solely from active inductors.

Similar tests performed on adaptive filters having a similar function but built solely from active inductors based on gyrators, have shown that the active filters have, by comparison, a third order intercept point equal to −10 dBm and an electrical consumption of 160 mA for the entire filter for a supply voltage of 1.2V, which is twice the consumption of the filter 10 in the example illustrated hereinabove.

Thus, judiciously combining active inductors and passive inductors for forming an adaptive filter, provides better performance, in particular, in terms of linearity and electrical consumption, while reducing the complexity of the filter design.

Many other embodiments are possible.

Any feature of one of the embodiments or variants described hereinabove can be implemented in the other embodiments and variants described.

The invention claimed is:

1. An active and adaptive radio frequency filter comprising an input, an output, a primary inter-stage, a secondary inter-stage, and a tertiary inter-stage connected together between the input and the output,
   the primary inter-stage being connected in series with the tertiary inter-stage through the secondary inter-stage,
   the primary inter-stage comprising a first primary fixed passive inductor, a first primary variable inductor and a first primary variable capacitor connected in parallel with the first primary fixed passive inductor,
   the first primary fixed passive inductor and the first primary variable inductor forming a first primary variable composite inductor,
   the secondary inter-stage comprising a secondary variable capacitor and a secondary fixed passive inductor connected in parallel,
   the tertiary inter-stage comprising a first tertiary fixed passive inductor, a first tertiary variable inductor and a first tertiary variable capacitor connected in parallel with the first tertiary fixed passive inductor,
   the first tertiary fixed passive inductor and the first tertiary variable inductor forming a first tertiary variable composite inductor,
   wherein the filter exhibits improved linearity performance, as quantified by a third order intercept point (IIP3), of at least +6 dBm.

2. The radio frequency filter according to claim 1, wherein the filter further includes at least one negative resistor associated with at least one variable active inductor.

3. The radio frequency filter according to claim 1, wherein the filter further includes a first inter-stage connected to the filter input, the first inter-stage including a fixed passive inductor connected in series or in parallel with a variable active inductor so as to form a variable composite inductor.

4. The radio frequency filter according to claim 1, wherein the filter further includes another inter-stage connected to the filter output, said inter-stage including a fixed passive inductor connected in series or in parallel with a variable active inductor so as to form a variable composite inductor.

5. The radio frequency filter according to claim 4, wherein a variable active inductor is connected in parallel with the fixed passive inductor so as to form a variable composite inductor.

6. An active and adaptive radio frequency filter comprising an input, an output, a primary inter-stage, a secondary inter-stage, and a tertiary inter-stage connected together between the input and the output, the primary inter-stage being connected in series with the tertiary inter-stage through the secondary inter-stage, the primary inter-stage comprising a first primary fixed passive inductor, a first primary variable inductor and a first primary variable capacitor connected in parallel with the first primary fixed passive inductor, the first primary fixed passive inductor and the first primary variable inductor forming a first primary variable composite inductor, the secondary inter-stage comprising a secondary variable capacitor and a secondary fixed passive inductor connected in parallel, the tertiary inter-stage comprising a first tertiary fixed passive inductor, a first tertiary variable inductor and a first tertiary variable capacitor connected in parallel with the first tertiary fixed passive inductor, the first tertiary fixed passive inductor and the first tertiary variable inductor forming a first tertiary variable composite inductor, wherein the adaptive radio frequency filter is an active filter, wherein the filter includes at least one variable active inductor, wherein the at least one variable active inductor includes a gyrator and a variable capacitor connected to the output of the gyrator, wherein the gyrator is built from transconductance amplifiers, and wherein the filter exhibits improved linearity performance, as quantified by a third order intercept point (IIP3), of at least +6 dBm.

7. The radio frequency filter according to claim 6, wherein each transconductance amplifier has an adjustable negative resistance for compensating the losses of the radio frequency filter.

8. The radio frequency filter according to claim 1, wherein the filter further includes an electronic control system configured for changing at least one operating parameter of the radio frequency filter.

9. The radio frequency filter according to claim 8, wherein the at least one operating parameter of the radio frequency filter is chosen from among the group consisting of: the cut-off frequency, the bandwidth, and the gain.

10. The radio frequency filter according to claim 1, wherein the primary inter-stage comprises a positive input, a negative input, a positive output, and a negative output, and wherein the primary inter-stage further comprises a second primary variable active inductor, the first and the second primary variable active inductors being included in a single primary module, the first primary variable active inductor being connected between the positive input and the positive output of the primary inter-stage, and the second primary variable active inductor being connected between the negative input and the negative output of the primary inter-stage.

11. The radio frequency filter according to claim 10, wherein the primary inter-stage includes a second primary fixed passive inductor connected in series with the second primary variable active inductor.

12. The radio frequency filter according to claim 10, wherein the primary inter-stage includes a second primary fixed passive inductor connected in parallel with the second primary variable active inductor.

13. The radio frequency filter according to claim 10, wherein the primary inter-stage comprises a second primary variable capacitor connected in parallel with the second primary variable active inductor.

14. The radio frequency filter according to claim 10, wherein the primary inter-stage comprises a second primary fixed passive inductor connected with the second primary variable active inductor and a second primary variable capacitor connected in parallel with the second primary variable active inductor.

15. An active and adaptive radio frequency filter comprising an input, an output, a primary inter-stage, a secondary inter-stage, and a tertiary inter-stage connected together between the input and the output, the primary inter-stage being connected in series with the tertiary inter-stage through the secondary inter-stage, the primary inter-stage comprising a first primary fixed passive inductor, a first primary variable inductor and a first primary variable capacitor connected in parallel with the first primary fixed passive inductor, the first primary fixed passive inductor and the first primary variable inductor forming a first primary variable composite inductor, the secondary inter-stage comprising a secondary variable capacitor and a secondary fixed passive inductor connected in parallel, the tertiary inter-stage comprising a first tertiary fixed passive inductor, a first tertiary variable inductor and a first tertiary variable capacitor connected in parallel with the first tertiary fixed passive inductor, the first tertiary fixed passive inductor and the first tertiary variable inductor forming a first tertiary variable composite inductor, wherein the adaptive radio frequency filter is an active filter, wherein the primary inter-stage comprises a positive input, a negative input, a positive output, and a negative output, and wherein the primary inter-stage further comprises a second primary variable active inductor, the first and the second primary variable active inductors being included in a single primary module, the first primary variable active inductor being connected between the positive input and the positive output of the primary inter-stage, and the second primary variable active inductor being connected between the negative input and the negative output of the primary inter-stage, wherein the tertiary inter-stage comprises a positive input, a negative input, a positive output, and a negative output, and wherein the tertiary inter-stage further comprises a second tertiary variable active inductor, the first and the second tertiary variable active inductors being included in a single tertiary module, the first tertiary variable active inductor being connected between the positive input and the positive output of the tertiary inter-stage, and the second tertiary variable active inductor being connected between the negative input and the negative output of the tertiary inter-stage, and wherein the filter exhibits improved linearity performance, as quantified by a third order intercept point (IIP3), of at least +6 dBm.

16. The radio frequency filter according to claim 15, wherein the tertiary inter-stage includes a second tertiary fixed passive inductor connected in series with the second tertiary variable active inductor.

17. The radio frequency filter according to claim 15, wherein the tertiary inter-stage includes a second tertiary fixed passive inductor connected in parallel with the second tertiary variable active inductor.

18. The radio frequency filter according to claim 15, wherein the tertiary inter-stage comprises a second tertiary variable capacitor connected in parallel with the second tertiary variable active inductor.

19. The radio frequency filter according to claim 15, wherein the tertiary inter-stage comprises a second tertiary fixed passive inductor connected with the second tertiary variable active inductor and a second tertiary variable capacitor connected in parallel with the second tertiary variable active inductor.

\* \* \* \* \*